United States Patent
Feuerstein et al.

(10) Patent No.: US 8,097,129 B2
(45) Date of Patent: Jan. 17, 2012

(54) MULTILAYER NITRIDE-CONTAINING COATINGS

(75) Inventors: Albert Feuerstein, Carmel, IN (US); Thomas Albert, Indianapolis, IN (US)

(73) Assignee: Praxair S.T. Technology, Inc., North Haven, CT (US)

( * ) Notice: Subject to any disclaimer, the term of this patent is extended or adjusted under 35 U.S.C. 154(b) by 0 days.

(21) Appl. No.: 13/013,090

(22) Filed: Jan. 25, 2011

(65) Prior Publication Data

US 2011/0117276 A1      May 19, 2011

Related U.S. Application Data

(62) Division of application No. 11/900,683, filed on Sep. 13, 2007, now Pat. No. 7,901,799.

(60) Provisional application No. 60/848,367, filed on Oct. 2, 2006.

(51) Int. Cl.
*C23C 16/00* (2006.01)

(52) U.S. Cl. .............. 204/192.16; 204/192.15

(58) Field of Classification Search ............ 204/192.15, 204/192.16
See application file for complete search history.

(56) References Cited

U.S. PATENT DOCUMENTS

| | | | |
|---|---|---|---|
| 4,643,951 A * | 2/1987 | Keem et al. | 428/469 |
| 4,904,542 A | 2/1990 | Mroczkowski | |
| 5,071,693 A | 12/1991 | Sue et al. | |
| 5,330,853 A * | 7/1994 | Hofmann et al. | 428/212 |
| 5,702,574 A | 12/1997 | Foster et al. | |
| 5,783,295 A * | 7/1998 | Barnett et al. | 428/216 |
| 5,879,753 A | 3/1999 | Zajchoowski et al. | |
| 5,997,947 A | 12/1999 | Burns et al. | |
| 6,025,021 A | 2/2000 | Sue | |
| 6,077,596 A * | 6/2000 | Hashimoto et al. | 428/216 |
| 6,797,335 B1 | 9/2004 | Paderov et al. | |

FOREIGN PATENT DOCUMENTS

| | | |
|---|---|---|
| CH | 684617 A3 | 11/1994 |
| EP | 0 043 781 B1 | 11/1986 |
| EP | 0 418 001 A | 3/1991 |
| GB | 2 135 337 A | 8/1984 |
| JP | 63 255369 | 10/1988 |
| MX | 9602042 A | 1/1900 |

OTHER PUBLICATIONS

Simpson, Gray. "Foreign Comparative Test Program on "Russian Erosion Resistant Coatings for US Navy GTE Compressors"." JTEG Meeting at Lima Army Tank Plant Jul. 24-26, 2001 (36 pgs.).

* cited by examiner

*Primary Examiner* — Archene Turner
(74) *Attorney, Agent, or Firm* — Robert J. Hampsch

(57) ABSTRACT

This invention relates to erosion resistant coatings comprising at least 2 sublayer systems in which each sublayer system is separated from another by an interlayer, wherein (i) each sublayer system is the same or different and comprises at least 4 layers, (ii) said layers comprise alternating layers of a nitride-containing compound of stoichiometric composition and a nitride-containing compound of nonstoichiometric composition, (iii) each sublayer system has a thickness of greater than about 0.4 microns, and (iv) each interlayer is the same or different and comprises a metal-containing compound. This invention also relates to a method for producing the coatings and to articles, e.g., gas turbine compressor rotor blade and stator vanes, coated with the coatings.

8 Claims, 4 Drawing Sheets

24kType 2
15 alternating
A' and b layers

24kType 4
15 alternating
A' and b layers
+Two Tiinterlayers

24kType 2
15 alternating
A' and b layers

24kType 4
15 alternating
A' and b layers
+Two Tiinterlayers

MULTILAYER NITRIDE-CONTAINING COATINGS

RELATED APPLICATIONS

This application is a Divisional Application of U.S. patent application Ser. No. 11/900,683, filed Sep. 13, 2007, now U.S. Pat. No. 7,901,799 which claims the benefit of U.S. Provisional Application Ser. No. 60/848,367, filed Oct. 2, 2006, which are incorporated herein by reference.

FIELD OF THE INVENTION

This invention relates to multilayer erosion resistant coatings, e.g., titanium nitride, methods for producing the multilayer erosion resistant coatings on a substrate, and articles that have been coated with the multilayer erosion resistant coatings, such as gas turbine compressor rotor blades and stator vanes. The multilayer erosion resistant coatings of this invention exhibit improved erosion resistance in reducing the size of pitting caused by large particle erosion.

BACKGROUND OF THE INVENTION

Resistance against erosion wear is normally related to the hardness of the wear part. Some articles are subject to solid particle erosion in which particles of various sizes and hardness are propelled at various angles against the surface of the articles. For example, a car traveling in the desert during a wind storm will encounter various size solid particles of sand traveling at various velocities hitting the car. If the size of the particles is large and the velocity of the particles is high, the coating on the car could be chipped or pitted.

In turbomachines which operate in a dust environment, this solid particle erosion is a severe problem. Physical and chemical vapor deposited coatings, such as titanium nitride coatings and zirconium nitride coatings, have been used to provide a protective layer having good hardness characteristics. These coatings have been found to have good erosion resistance to $Al_2O_3$ and $SiO_2$ particles at both high and low impact angles. Although these coatings have high hardness characteristics, they exhibit inherently brittle behavior and their erosion resistance at normal impact decreases markedly with increasing hardness and particle size of the erodent.

It has been observed that dynamic impact of solid particle erodents onto a coated surface of an article can form lateral and/or median cracks around the impact site. Median cracks are responsible for the strength degradation of the material while lateral cracks, which grow from the center of impact parallel to the substrate surface and then propagate through the coating surface, account for most of the material loss during solid particle impact erosion. The solid particle impact erosion of these coatings at a 90° impact angle is due primarily to brittle fracture.

Thin coatings are more susceptible to spalling and exposure of the substrate which may lead to premature failure of the article. When coatings applied by conventional techniques are exposed to particle impact, pinholes and/or lateral spalling pits generally result in the coating. Once the coating material is cracked, additional impact by even relatively small particles will cause furrowing or grooves in the coating material. In a turbomachine, this furrowing can greatly effect the overall performance of the turbomachine.

Toughness and hardness are the dominant properties controlling the erosion behavior. Higher hardness is believed to increase erosion resistance at both low and high impingement angles while higher toughness reduces the vulnerability to brittle fracture and markedly increases 90° erosion resistance. An erosion resistant coating needs to be simultaneously hard and tough. However, hardness and toughness are generally in opposition in hard materials. Higher hardness is usually associated with greater brittleness. Multilayer hard compound materials have been found to have simultaneously high hardness and high toughness. The high hardness is an inherent property of hard compounds and the high toughness is attributed to the formation of a coherent or partly coherent interface boundary between two different hard compound layers.

It has been found that conventional erosion resistant coatings can be used to protect compressor blades and vanes against fine sand erosion such as coarse AZ road dust with a median particle size of approximately 40 microns, a maximum particle size of approximately 170 microns, and a minimum particle size of approximately 0.85 microns. See, for example, U.S. Pat. No. 5,071,693 which describes a multilayer coated substrate having good erosion and/or wear resistance characteristics to fine solid particle impact.

However, conventional erosion resistant coatings are not very well performing in the case of large particle erosion media such as 40 mesh Sakrete sand with a median particle size of 230 microns. When eroded with large particle media, conventional coatings are shattered and large pits are created. Subsequently, fine particle media can attack the edges of the large pits and cause acceleration of the erosion.

There continues to be a need in the art for erosion resistant coatings that perform well in the case of both small and large particle erosion media. The erosion resistant coatings should perform well, for example, in the case of large particle erosion media such as 40 mesh Sakrete sand with a median particle size of 230 microns.

SUMMARY OF THE INVENTION

This invention relates to a coating comprising at least 2 sublayer systems in which each sublayer system is separated from another by an interlayer, wherein (i) each sublayer system is the same or different and comprises at least 4 layers, (ii) said layers comprise alternating layers of a nitride-containing compound of stoichiometric composition and a nitride-containing compound of nonstoichiometric composition, (iii) each sublayer system has a thickness of greater than about 0.4 microns, and (iv) each interlayer is the same or different and comprises a metal-containing compound.

This invention also relates to a method for producing a coating on a substrate comprising:
  (a) placing a substrate to be coated in a chamber containing a metal-target and a nitrogen-containing gas mixture;
  (b) evaporating the metal from the metal target to produce a metal vapor to react with the nitrogen in the nitrogen-containing gas mixture to form a stoichiometric nitride-containing layer on the substrate;
  (c) changing the nitrogen content of the nitrogen-containing gas mixture and repeating step (b) to form a nonstoichiometric nitride-containing layer on the stoichiometric nitride-containing layer of step (b);
  (d) changing the nitrogen content of the nitrogen-containing gas mixture and repeating step (b) to form a stoichiometric nitride-containing layer on the nonstoichiometric nitride-containing layer of step (c);
  (e) changing the nitrogen content of the nitrogen-containing gas mixture and repeating step (c) to form a nonstoichiometric nitride-containing layer on the stoichiometric nitride-containing layer of step (d);

(f) optionally repeating steps (b) and (c) to form additional alternating stoichiometric nitride-containing layers and nonstoichiometric nitride-containing layers;

(g) evaporating the metal from the metal target to produce a metal vapor to form a metal-containing interlayer on the nonstoichiometric nitride-containing layer of step (e) or (f), thereby forming a first sublayer system having a thickness of greater than about 0.4 microns;

(h) repeating steps (b)-(g) to form a second sublayer system having a thickness of greater than about 0.4 microns; and (i) optionally repeating step (h) to form one or more other sublayer systems each having a thickness of greater than about 0.4 microns.

This invention further relates to an article coated with a coating, said coating comprising at least 2 sublayer systems in which each sublayer system is separated from another by an interlayer, wherein (i) each sublayer system is the same or different and comprises at least 4 layers, (ii) said layers comprise alternating layers of a nitride-containing compound of stoichiometric composition and a nitride-containing compound of nonstoichiometric composition, (iii) each sublayer system has a thickness of greater than about 0.4 microns, and (iv) each interlayer is the same or different and comprises a metal-containing compound.

The erosion resistant coatings of this invention perform well in the case of both small and large particle erosion media. Particularly, the erosion resistant coatings of this invention perform in the case of large particle erosion media such as 40 mesh Sakrete sand with a median particle size of 230 microns. The coatings of this invention have desired erosion resistance to small particle erosion combined with desired erosion resistance to large particle erosion, and also offer significant cost advantages.

DETAILED DESCRIPTION OF THE INVENTION

As indicated above, this invention relates to a coating comprising at least 2 sublayer systems in which each sublayer system is separated from another by an interlayer, wherein (i) each sublayer system is the same or different and comprises at least 4 layers, (ii) said layers comprise alternating layers of a nitride-containing compound of stoichiometric composition and a nitride-containing compound of nonstoichiometric composition, (iii) each sublayer system has a thickness of greater than about 0.4 microns, and (iv) each interlayer is the same or different and comprises a metal-containing compound.

The coatings of this invention improve erosion resistance to larger particle media. This is accomplished by partitioning the coating into at least 2, preferably 3 or more, sublayer systems, each sublayer system having a thickness of greater than about 0.4 microns. The sublayer systems are separated from each other by pure metal, e.g., titanium, interlayers. The ductile metal, e.g., titanium, interlayers act as a compliance layer to reduce the lateral progression of the pitting and thus to promote the cohesion of the underlying sublayer system.

Figure 1:
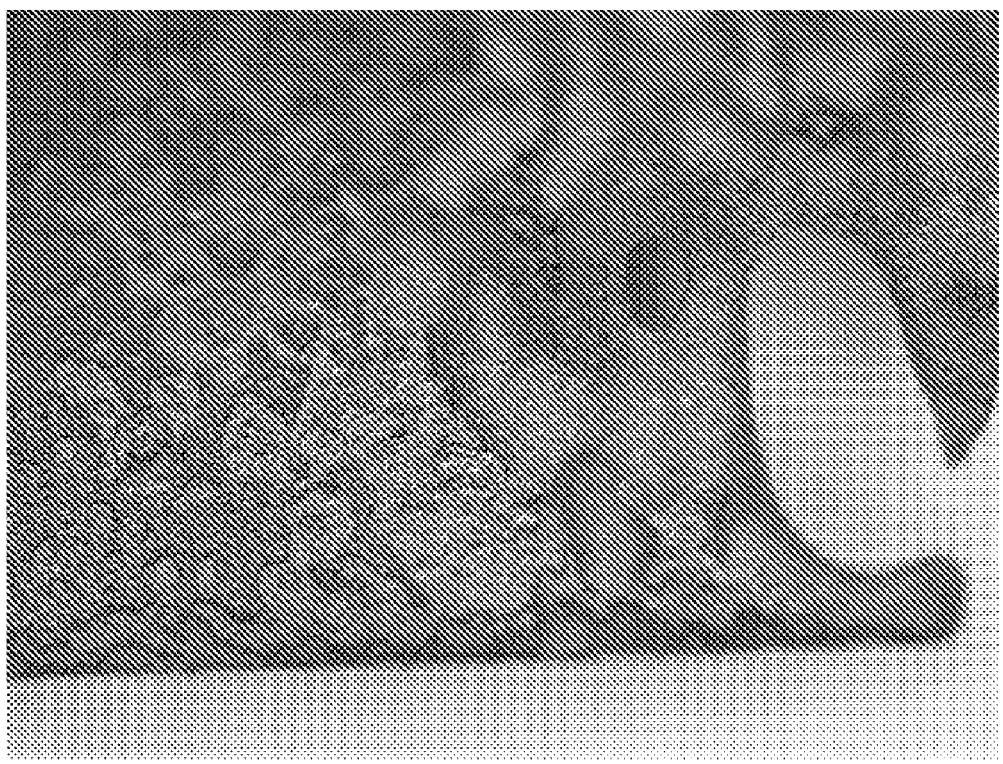
FIG. 1 is a photograph showing progression of coating erosion with increasing large particle erodent dose from left to right in magnification.

In case of a large particle impact, only the upper layer of the partitioned coating would eventually pit and lift off, which in case of using 3 sublayer systems basically triples the life of the coating from a probability point of view. Once the upper sublayer system is removed, another large particle impact can attack the underlying sublayer. This "onion peeling" effect is shown in FIG. 1. A non-uniform erodent jet hits the trailing edge of an airfoil. The progression of the erosion damage is clearly seen in FIG. 1.

Figure 2:
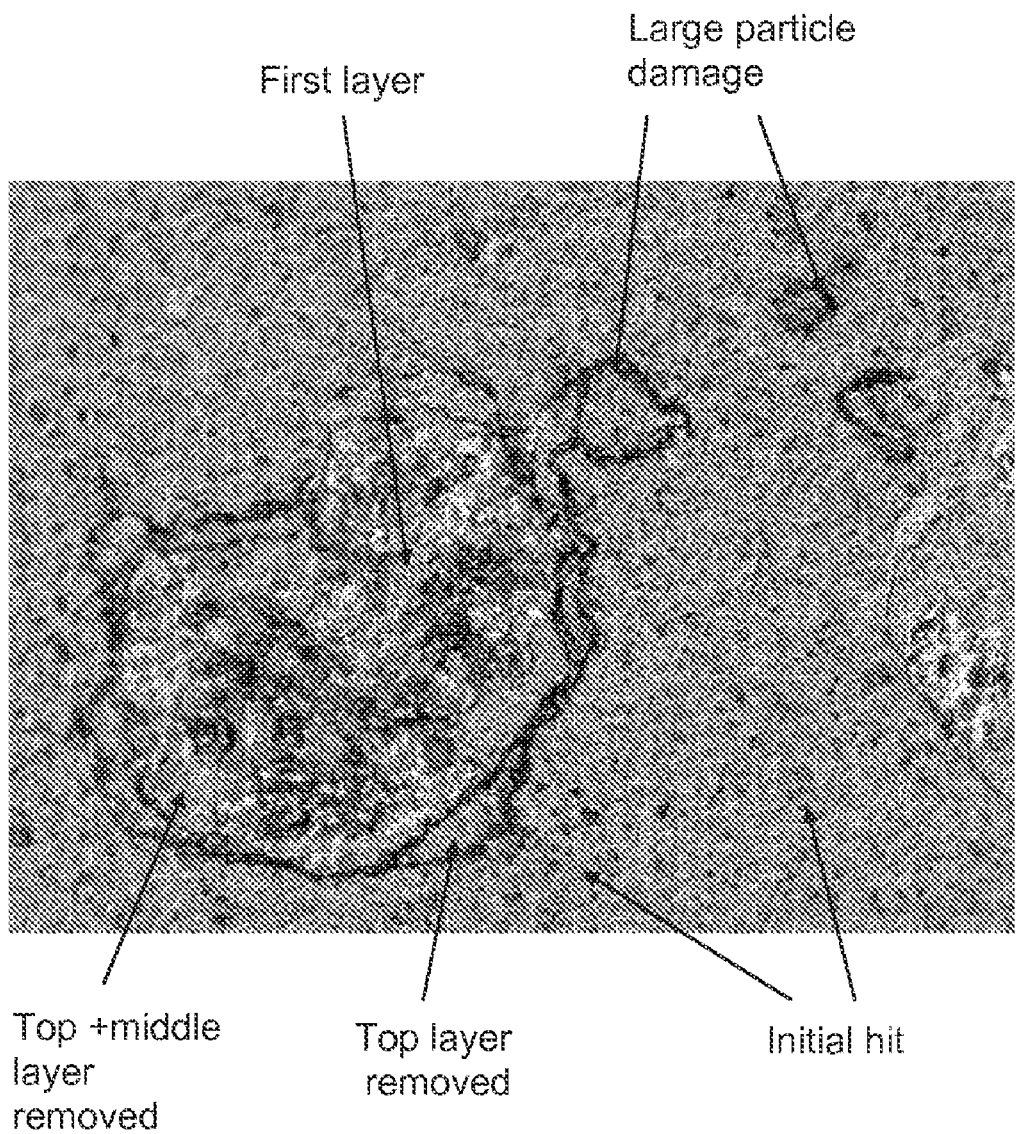
FIG. 2 is a photograph showing the coating defect formation in FIG. 1 at a larger magnification (50×).

It starts out with isolated pits which penetrate the first sublayer system. With progressive erodent dose, the pit diameter is expanded and finally the first layer is eroded away. Then the second and third sublayers are eroded accordingly. From an impact probability point of view, the life of the coating can be largely extended. Basically, the lifetime of the coating is extended by a factor of N where N is the number of sublayer systems from which the coating is composed. FIG. 2 shows the defect formation (erosion pattern after 500 grams of Sakrete sand) at a larger magnification. In FIG. 2, the initiation of the coating delamination in the top layer and then the progressive defect growth (peeling) into the lower layers is visible.

In an embodiment, the method for producing a coating on a substrate of this invention uses only one evaporation material to produce the ceramic coating layers and the metal interlayers. It also uses a coating system architecture which has desired resistance to small media erosion (AZ Road Dust). Thus, the coatings of this invention have desired erosion resistance to small particle erosion combined with desired erosion resistance to large particle erosion, and also significant cost advantages.

The coating economy of a single material coating process is much better than that of a conventional multi-material process, because all cathodes can be used simultaneously at any time. In the case of the multi material process, only part of the cathodes can be used, dependent on the coating layer requirement. The latter also limits the maximum deposition speed for a given equipment configuration. Also, the equipment cost is higher because of the additional evaporators. Thus, the coating method of this invention is a cost effective coating process.

The coatings of this invention include at least 2 sublayer systems, preferably at least 3 sublayer systems, and more preferably at least 5 sublayer systems. Each sublayer system includes at least 4 layers, preferably at least 6 layers, and more preferably at least 10 layers. More layers, e.g., 16 and higher, may also be useful for certain applications.

In the coatings of this invention, the sublayer systems comprise alternating layers of a nitride-containing compound of stoichiometric composition and a nitride-containing compound of nonstoichiometric composition. The nitride-containing compounds of stoichiometric composition can be selected from a wide variety of nitrides including, but not limited to, TiN, TiCN, TiZrN, TiZrCN, TiAlN and TiAlCN. Preferably, the nitride-containing compound of stoichiometric composition is titanium nitride, zirconium nitride or titanium aluminum nitride.

The nitride-containing compounds of nonstoichiometric composition can be selected from a wide variety of nitrides. Preferably the nitride-containing compound is of substoichiometric composition having an atomic percent of nitrogen from about 33% to about 45%, preferably 39% to 42%.

The sublayer systems of the coatings of this invention are separated from each other by pure metal, e.g., titanium, interlayers. The ductile metal, e.g., titanium, interlayers act as a compliance layer to reduce the lateral progression of the pitting and thus to promote the cohesion of the underlying sublayer system. The interlayers of the coatings of this invention can be selected from a wide variety of metal-containing compounds. Illustrative metal-containing compounds include titanium, zirconium, and titanium aluminum.

In the coatings of this invention, at least one layer in each sublayer system can contain at least one additive selected from titanium, titanium alloys, zirconium and zirconium alloys. Also, at least one layer in each sublayer system can contain at least one element selected from aluminum, vanadium, molybdenum, niobium, iron, chromium and manganese.

Each of the sublayer systems in a coating of this invention can have the same or different thickness. For example, each sublayer system can have a thickness of greater than about 1 micron, preferably greater than about 5 microns, and more preferably greater than about 10 microns. Each layer of the sublayer systems can have the same or different thickness. For example, each layer can have a thickness of about 0.1 microns or greater, preferably about 1 micron or greater. Each interlayer of the sublayer systems can have the same or different thickness. For example, each interlayer can have a thickness of about 0.1 microns or greater, preferably about 1 micron or greater.

The thickness of the layer of a nitride-containing compound of nonstoichiometric composition is preferably greater than the thickness of the layer of a nitride-containing compound of stoichiometric composition. The thickness of the interlayer is preferably greater than the thickness of the layer of a nitride-containing compound of stoichiometric composition. The interlayer and the layer of a nitride-containing compound of nonstoichiometric composition preferably have about the same or similar thickness.

In an embodiment, the ratio of the thickness of a layer of a nitride-containing compound of nonstoichiometric composition to the thickness of a layer of a nitride-containing compound of stoichiometric composition is from about 1:1 to about 20:1. The overall thickness of the coating can range from about 5 to about 50 microns or greater, preferably from about 10 to about 40 microns or greater.

As indicated above, this invention also relates to a method for producing a coating on a substrate comprising:
 (a) placing a substrate to be coated in a chamber containing a metal-target and a nitrogen-containing gas mixture;
 (b) evaporating the metal from the metal target to produce a metal vapor to react with the nitrogen in the nitrogen-containing gas mixture to form a stoichiometric nitride-containing layer on the substrate;
 (c) changing the nitrogen content of the nitrogen-containing gas mixture and repeating step (b) to form a nonstoichiometric nitride-containing layer on the stoichiometric nitride-containing layer of step (b);
 (d) changing the nitrogen content of the nitrogen-containing gas mixture and repeating step (b) to form a stoichiometric nitride-containing layer on the nonstoichiometric nitride-containing layer of step (c);
 (e) changing the nitrogen content of the nitrogen-containing gas mixture and repeating step (c) to form a nonstoichiometric nitride-containing layer on the stoichiometric nitride-containing layer of step (d);
 (f) optionally repeating steps (b) and (c) to form additional alternating stoichiometric nitride-containing layers and nonstoichiometric nitride-containing layers;
 (g) evaporating the metal from the metal target to produce a metal vapor to form a metal-containing interlayer on the nonstoichiometric nitride-containing layer of step (e) or (f), thereby forming a first sublayer system having a thickness of greater than about 0.4 microns;
 (h) repeating steps (b)-(g) to form a second sublayer system having a thickness of greater than about 0.4 microns; and
 (i) optionally repeating step (h) to form one or more other sublayer systems each having a thickness of greater than about 0.4 microns.

In a preferred embodiment, this invention relates to a method for producing a coating on a substrate comprising:
 (a) placing a substrate to be coated in a chamber containing a titanium-target and a nitrogen-containing gas mixture;
 (b) evaporating the titanium from the titanium target to produce a titanium vapor to react with the nitrogen in the nitrogen-containing gas mixture to form a stoichiometric titanium nitride-containing layer on the substrate;
 (c) changing the nitrogen content of the nitrogen-containing gas mixture and repeating step (b) to form a nonstoichiometric titanium nitride-containing layer on the stoichiometric titanium nitride-containing layer of step (b);
 (d) changing the nitrogen content of the nitrogen-containing gas mixture and repeating step (b) to form a stoichiometric titanium nitride-containing layer on the nonstoichiometric titanium nitride-containing layer of step (c);
 (e) changing the nitrogen content of the nitrogen-containing gas mixture and repeating step (c) to form a nonstoichiometric titanium nitride-containing layer on the stoichiometric titanium nitride-containing layer of step (d);
 (f) optionally repeating steps (b) and (c) to form additional alternating stoichiometric titanium nitride-containing layers and nonstoichiometric titanium nitride-containing layers;
 (g) evaporating the titanium from the titanium target to produce a titanium vapor to form a titanium-containing interlayer on the nonstoichiometric titanium nitride-containing layer of step (e) or (0, thereby forming a first sublayer system having a thickness of greater than about 0.4 microns;
 (h) repeating steps (b)-(g) to form a second sublayer system having a thickness of greater than about 0.4 microns; and
 (i) optionally repeating step (h) to form one or more other sublayer systems having a thickness of greater than about 0.4 microns.

In a preferred embodiment, step (i) is repeated until said coating is produced having at least 3 sublayer systems with up to about 8 layers in each sublayer system.

The nitrogen-containing gas mixture could be argon-nitrogen; krypton nitrogen; helium-nitrogen; xenon-nitrogen; neon-nitrogen or the like. Preferably, the nitrogen-containing gas mixture is argon-nitrogen.

The coatings of this invention can be applied to a variety of substrates. Illustrative substrates include those selected from titanium, steel, aluminum, nickel, cobalt and alloys thereof. Preferably, the coatings are applied to said substrate by physical vapor deposition. Illustrative substrates include, for example, gas turbine compressor rotor blades or stator vanes.

The multilayer coatings of this invention can be deposited by using conventional process techniques such as chemical vapor deposition and physical vapor deposition such as arc processes, dc and rf magnetron sputtering, reactive ion plating and the like. The changing of the ratio of nitrogen to titanium for the alternate lamellar layers will interrupt the grain growth process of the coating compound so that the grain size of the compound is no larger than the thickness of the individual layers.

A layer containing less than 33 atomic percent of nitrogen will be relatively reactive and susceptible to burning during solid particle impact. A layer containing more than 50 atomic percent of nitrogen will generally have a relatively high compressive stress and be prone to lateral spalling.

A preferred coating would comprise a layer of titanium nitride having stoichiometric composition alternating with a layer of titanium nitride having a substoichiometric composition, e.g., an atomic percent of nitrogen from 33% to 45%, with titanium metal interlayers. Titanium nitride with the above ranges of nitrogen can have the same orientation and crystallographic structure with a small difference in lattice spacings so that coherent interfaces between the layers can be expected to produce a high toughness characteristic.

Hardness and toughness of a multilayer coating are closely related to compositions and spacings of layers. The individual layer thickness and overall thickness of the multilayer coating depends on specific applications. For systems applications requiring high toughness, the layer with the smaller content of nitrogen should be from 1 to 20 times thicker than the layer containing the higher content of nitrogen. An overall coating thickness of from 5 microns up to 30 microns thick is generally adequate for most erosion applications.

Physical vapor deposition in a coating chamber can be conducted by conventional methods known in the art. See, for example, U.S. Pat. No. 5,071,693, the disclosure of which is incorporated herein by reference. Illustrative erosion resistant coating systems that can be used with the coating fixtures of this invention include TiN, TiCN, TiZrN, TiZrCN, TiAlN, TiAlCN, and the like. Physical vapor deposition can be used to apply the erosion resistant coatings by reactive evaporation or sputtering, for example, by cathodic arc evaporation, hollow cathode reactive electron beam evaporation, reactive sputtering, and the like.

In an embodiment, a fixture can be used in the coating method of this invention as described in U.S. patent application Ser. No. 11/446,380, filed Jun. 6, 2006, which is incorporated herein by reference. The fixture comprises:

a support structure comprising a circular base member, a circular top member opposite the circular base member, and a plurality of structural members joining said top member to said base member;

a plurality of panel members aligned in a vertical direction around the outer periphery of said support structure forming a cylinder-like structure, said panel members secured on said circular top member and said circular base member;

said panel members including a plurality of apertures for holding workpieces to which a coating is to be applied, said apertures facing outwardly away from said support structure, and said apertures configured for receiving a portion of said workpieces that does not require coating;

said panel members comprising a plurality of plate members, at least some of said plate members providing a barrier for segregating the internal volume of said apertures from the volume external to said apertures and for securing said workpieces in said apertures; and said apertures positioned on said panel members so that said workpieces are aligned in a vertical direction and a portion of the workpieces that requires coating extends into the volume external to said apertures and a portion of the workpieces that does not require coating is maintained within the internal volume of said apertures, so that there is essentially no direct communication between the internal volume of the apertures and the external volume of the apertures across said barrier.

Additionally, the coating method of this invention can simultaneously coat a plurality of workpieces by:

providing a fixture comprising:

a support structure comprising a circular base member, a circular top member opposite the circular base member, and a plurality of structural members joining said top member to said base member;

a plurality of panel members aligned in a vertical direction around the outer periphery of said support structure forming a cylinder-like structure, said panel members secured on said circular top member and said circular base member;

said panel members including a plurality of apertures for holding workpieces to which a coating is to be applied, said apertures facing outwardly away from said support structure, and said apertures configured for receiving a portion of said workpieces that does not require coating;

said panel members comprising a plurality of plate members, at least some of said plate members providing a barrier for segregating the internal volume of said apertures from the volume external to said apertures and for securing said workpieces in said apertures; and said apertures positioned on said panel members so that said workpieces are aligned in a vertical direction and a portion of the workpieces that requires coating extends into the volume external to said apertures and a portion of the workpieces that does not require coating is maintained within the internal volume of said apertures so that there is essentially no direct communication between the internal volume of the apertures and the external volume of the apertures across said barrier;

(ii) loading and securing workpieces into said apertures of said panel members;

(iii) positioning said fixture onto a rotatable drive system in a coating chamber having a source of coating material; and (iv) operating the drive system to cause the fixture to rotate and simultaneously coating by physical vapor deposition that portion of said workpieces that extends into the volume external to said apertures.

As also indicated above, this invention relates to articles coated with the coatings of this invention, said coatings comprising at least 2 sublayer systems in which each sublayer system is separated from another by an interlayer, wherein (i) each sublayer system is the same or different and comprises at least 4 layers, (ii) said layers comprise alternating layers of a nitride-containing compound of stoichiometric composition and a nitride-containing compound of nonstoichiometric composition, (iii) each sublayer system has a thickness of greater than about 0.4 microns, and (iv) each interlayer is the same or different and comprises a metal-containing compound.

Illustrative coated articles include, for example, gas turbine compressor rotor blades and stator vanes. For such applications, the erosion resistant coatings of this invention perform well in the case of both small and large particle erosion media, particularly, in the case of large particle erosion media such as 40 mesh Sakrete sand with a median particle size of 230 microns. Because the coatings of this invention have desired erosion resistance to small particle erosion combined with desired erosion resistance to large particle erosion, the coated articles of this invention can vary greatly.

In some applications, it may be advisable to have a relatively thick first layer of the nitride containing compound to support subsequent multilayers of the coating and/or a thick top layer to provide a harder top surface.

Various modifications and variations of this invention will be obvious to a worker skilled in the art and it is to be understood that such modifications and variations are to be included within the purview of this application and the spirit and scope of the claims.

Example 1

Multilayer titanium nitride coatings are deposited on Ti 6Al-4V substrates using a physical vapor deposition arc evaporation process. Before deposition, the vapor deposition chamber is evacuated to a pressure below $7 \times 10^{-4}$ Pa and then backfilled with argon to 0.7 Pa. The substrate to be coated is sputtered to remove surface contaminants. Subsequently, a direct current arc is activated across a titanium cathode and a chamber which acts as an anode to evaporate Ti from the Ti cathode in an Ar—$N_2$ gas mixture at an overall pressure between 1.3 to 4.8 Pa. The ionized Ti vapor reacts with $N_2$ ions and then forms titanium nitride coatings on the substrates. The layered structure of the coating is formed by altering the nitrogen $N_2$ gas flow rates during the deposition. Typically, the coating consists of a lamellar structure of alternating A and B nitride layers in which the A layer is of stoichiometric composition and the B layer is of nonstoichiometric composition. The thickness of the B layer is greater than that of the A layer.

Erosion properties of the multilayer coatings on 1.5×25×50 mm Ti-6Al-4V samples are determined by impacting with angular Sakrete sand particles at 20° and 90° impingement angles. The test apparatus is set up according to the recommended guidelines of the American Society of Testing Materials, ASTM G 76-83. Compressed air with a pressure of 276 kPa is used to carry Sakrete sand particles with a nominal particle size of 230 microns through a 5 millimeter diameter alumina nozzle. The nozzle-to-specimen distance is maintained at 100 millimeters. Generally, the erosion rate is measured in terms of the weight loss of the coating per unit gram of the erodent used in the test.

Example 2

Figure 3:
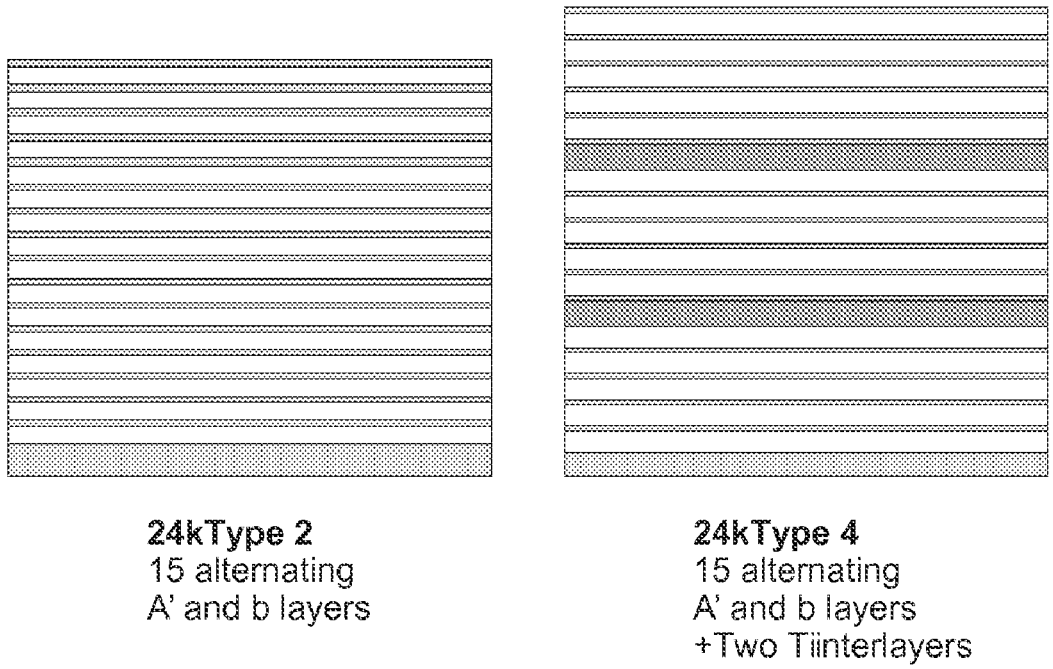
FIG. 3 is a depiction of a coating system designated as 24kType 2 (TiN multilayer coating with alternating fully stoichiometric and substoichiometric layers (TiN/TiN[1-x]), and a coating system designated as 24kType 4 (TiN multilayer coating with alternating fully stoichiometric and substoichiometric layers (TiN/TiN[1-x] interrupted by titanium interlayers).

Multilayer titanium nitride coatings were deposited on Ti 6Al-4V substrates using a physical vapor deposition arc evaporation process similar to Example 1. One coating system designated as 24kType 2 is a TiN multilayer coating with alternating fully stoichiometric and substoichiometric layers (TiN/TiN[1-x]). The other coating system designated as 24kType 4 is a TiN multilayer coating with alternating fully stoichiometric and substoichiometric layers (TiN/TiN[1-x] interrupted by titanium interlayers. See FIG. 3 for a depiction of the 24kType 2 coating system and the 24kType 4 coating system. In FIG. 3, the A' layers are of smaller thickness and are stoichiometric layers (TiN) and the b layers are of larger thickness and are substoichiometric layers (TiN[1-x]). The interlayers of the 24kType 4 coating system are pure Ti layers and are about the same thickness as the b substoichiometric layers.

Erosion properties of the 24kType 2 coating system and the 24kType 4 coating system on as coated and air oxidized IN718 erosion panels were determined at room temperature by impacting with angular Sakrete sand particles (40 mesh) at a 20° impingement angle. The blast parameters were in accordance with QCI G-168. To reveal an eventual negative impact of the Ti oxidation on the erosion, an air oxidation was performed at 500-550° C. for 8 hours. The erosion results are set forth in Table 1 below.

TABLE 1

| Coating | Erodent mass (g) | Erosion rate Ti64 Baseline (×10−6) | Comment |
| --- | --- | --- | --- |
| 24kType 4 | | | |
| 20 micron 24kType 4 on erosion panel IN718 | 250 | 14.8 | |
| 20 micron 24kType 4 on erosion panel IN718 | 250 plus (500 total) | 54.4 | Partial breakthrough |
| 20 micron 24kType 4 on erosion panel IN718 | 250 | 18. | |
| 20 micron 24kType 4 on erosion panel IN718 | 250 plus (500 total) | 22. | Partial breakthrough |
| 24kType 4 - oxidized | | | |
| 20 micron 24kType 4 on erosion panel IN718 oxidized | 250 | 26 | Partial breakthrough |
| 20 micron 24kType 4 on erosion panel IN718 oxidized | 250 plus (500 total) | 44. | Partial breakthrough |
| 24kType 2 reference data | | | |
| 15-20 micron 24kType 2 on erosion panel IN718 - baseline coating | 100 | 342 | Breakthrough |
| 15-20 micron 24kType 2 on erosion panel IN718 - baseline coating | 500 | 238.4 | Breakthrough |

Figure 4:
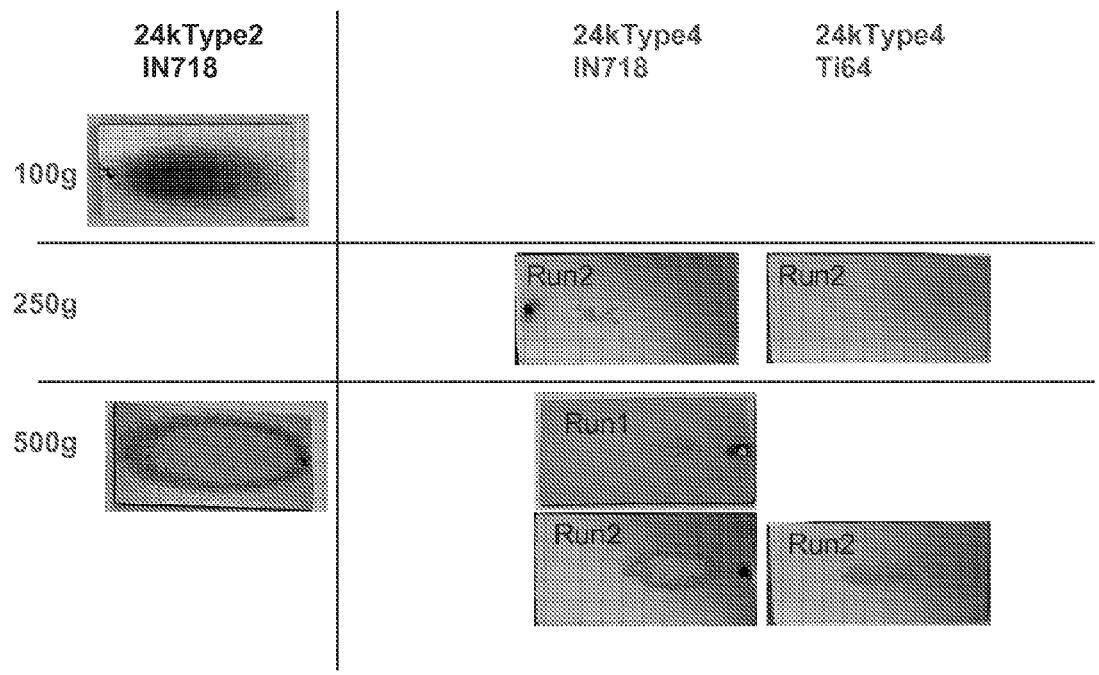
FIG. 4 is a collection of photographs showing a comparison of large particle erosion for 24kType 4 and 24kType 2 coatings from Example 2.

The data support the superiority of 24kType 4 over 24kType 2 in case of large particle erosion (Sakrete sand 40 mesh). Also, there is no evidence for an adverse effect of a long term air exposure at elevated temperatures. See FIG. 4 for the appearance of the eroded samples. The superiority of 24kType 4 over 24kType 2 in case of large particle erosion (Sakrete sand 40 mesh) is clearly visible.

The invention claimed is:

1. A method for producing a coating on a substrate comprising:
   (a) placing a substrate to be coated in a chamber containing a metal-target and a nitrogen-containing gas mixture;
   (b) evaporating the metal from the metal target to produce a metal vapor to react with the nitrogen in the nitrogen-containing gas mixture to form a stoichiometric nitride-containing layer on the substrate;
   (c) changing the nitrogen content of the nitrogen-containing gas mixture and repeating step (b) to form a nonstoichiometric nitride-containing layer on the stoichiometric nitride-containing layer of step (b);
   (d) changing the nitrogen content of the nitrogen-containing gas mixture and repeating step (b) to form a stoichiometric nitride-containing layer on the nonstoichiometric nitride-containing layer of step (c);
   (e) changing the nitrogen content of the nitrogen-containing gas mixture and repeating step (c) to form a nonstoichiometric nitride-containing layer on the stoichiometric nitride-containing layer of step (d);
   (f) optionally repeating steps (b) and (c) to form additional alternating stoichiometric nitride-containing layers and nonstoichiometric nitride-containing layers thereby forming a first sublayer system having a thickness of greater than about 0.4 microns;

(g) evaporating the metal from the metal target to produce a metal vapor to form a metal-containing interlayer on the nonstoichiometric nitride-containing layer of step (e) or (f) and wherein the metal is selected from the group consisting of titanium, zirconium or titanium aluminum and wherein the thickness of said layers of a nitride-containing compound of nonstoichiometric composition are greater than the thickness of said layer of a nitride-containing compound of stoichiometric composition, and the thickness of said interlayer is greater than the thickness of said layer of a nitride-containing compound of stoichiometric composition; and (h) repeating steps (b)-(f) to form at least one additional sublayer system having a thickness of greater than about 0.4 microns.

2. The method of claim 1, wherein the metal target is a titanium target, the stoichiometric nitride-containing layers are stoichiometric titanium nitride-containing layers, the nonstoichiometric nitride-containing layer is a nonstoichiometric titanium nitride-containing layer, and the metal containing interlayer is a titanium-containing interlayer.

3. The method of claim 1, wherein the stoichiometric nitride-containing layer is selected from TiN, TiCN, TiZrN, TiZrCN, TiAlN and TiAlCN.

4. The method of claim 1, wherein said nitrogen-containing gas mixture is selected from argon-nitrogen; krypton-nitrogen; helium-nitrogen; xenon-nitrogen; and neon-nitrogen.

5. The method of claim 1, wherein said substrate is selected from titanium, steel, aluminum, nickel, cobalt and alloys thereof.

6. The method of claim 1, wherein said substrate is coated by physical vapor deposition.

7. The method of claim 1, in which said substrate comprises a gas turbine compressor rotor blade or stator vane.

8. The method of claim 1, wherein said coating produced has at least 3 sublayer systems with at least 8 layers in each sublayer system.

* * * * *